(12) United States Patent
Lo et al.

(10) Patent No.: US 7,015,116 B1
(45) Date of Patent: Mar. 21, 2006

(54) STRESS-RELIEVED SHALLOW TRENCH ISOLATION (STI) STRUCTURE AND METHOD FOR FORMING THE SAME

(75) Inventors: Guo-Qiang (Patrick) Lo, Portland, OR (US); Brian Schorr, Portland, OR (US); Gary Foley, Beaverton, OR (US); Shih-Ked Lee, Hillsboro, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 12 days.

(21) Appl. No.: 10/897,601

(22) Filed: Jul. 23, 2004

Related U.S. Application Data

(62) Division of application No. 10/251,550, filed on Sep. 20, 2002, now Pat. No. 6,791,155.

(51) Int. Cl.
*H01L 21/76* (2006.01)

(52) U.S. Cl. .................................. 438/437; 438/435
(58) Field of Classification Search ............... None
See application file for complete search history.

(56) References Cited

U.S. PATENT DOCUMENTS

| | | | |
|---|---|---|---|
| 5,098,856 A | 3/1992 | Beyer et al. ............... 437/65 |
| 5,387,538 A | 2/1995 | Moslehi ..................... 437/67 |
| 5,508,234 A | 4/1996 | Dusablon, Sr. et al. ..... 437/228 |
| 6,001,705 A | 12/1999 | Sombrano ................ 438/421 |
| 6,071,805 A | 6/2000 | Liu .......................... 438/619 |
| 6,187,651 B1 | 2/2001 | Oh ........................... 438/435 |
| 6,221,733 B1 | 4/2001 | Li et al. .................... 438/424 |
| 6,297,128 B1 | 10/2001 | Kim et al. ................ 438/437 |
| 6,376,859 B1 | 4/2002 | Swanson et al. ............ 257/49 |
| 6,406,975 B1 | 6/2002 | Lim et al. ................. 438/421 |
| 2002/0051423 A1 | 5/2002 | Kim et al. ................ 438/624 |

OTHER PUBLICATIONS

T. Kuroi, T. Uchida, K. Horita, M. Sakai, Y. Itoh, Y. Inoue and T. Nishimura "Stress Analysis of Shallow Trench Isolation for 256MDRAM and beyond," IEDM Tech. Dig. 1998, pp. 141-144.

Tai-Kyung Kim, Do-Hyung Kim, Jae-Kwan Park, Tai Su Park, Young-Kwan Park, Hoong-Joo Lee, Kang-Yoon Lee, Jeong-Taek Kong, and Jong-Woo Park "Modeling of Cummulative Thermo-Mechanical Stress (CTMS) Produced by the Shallow Trench Isolation Process for 1Gb DRAM and beyond, " IEDM Tech. Dig. 1998, pp. 145-149.

K. Saino, K. Okonogi, S. Horiba, M. Sakao, M. Komuro, Y. Takaishi, T. Sakoh, K. Yoshida and K. Koyama "Control of Trench Sidewall Stress in Bias ECR-CVD Oxide-Filled STI for Enhanced DRAM Data Retention Time," IEDM Tech. Dig. 1998, pp. 149-152.

*Primary Examiner*—David A. Zarneke
(74) *Attorney, Agent, or Firm*—Marger, Johnson & McCollom, P.C.

(57) ABSTRACT

A shallow trench isolation (STI) structure in a semiconductor substrate and a method for forming the same are provided. A trench is formed in a semiconductor substrate. A first dielectric layer is formed on sidewalls of the trench. The first dielectric layer is formed thicker at a top portion of the sidewalls than a bottom portion of the sidewalls and leaving an entrance of the trench open to expose the trench. A second dielectric layer is conformally formed on the first dielectric layer to close the entrance, thus forming a void buried within the trench. Thus, the stress between the trench dielectric layer and the surrounding silicon substrate during thermal cycling can be substantially reduced.

14 Claims, 2 Drawing Sheets

STRESS-RELIEVED SHALLOW TRENCH ISOLATION (STI) STRUCTURE AND METHOD FOR FORMING THE SAME

This application is a divisional of application Ser. No. 10/251,550, filed Sep. 20, 2002, now U.S. Pat. No. 6,791,155.

BACKGROUND OF THE INVENTION

1. Field of the Invention

The present invention relates to the field of semiconductor manufacturing and, more particularly, to a stress-relieved shallow trench isolation (STI) structure and a method for fabricating the same.

2. Description of the Related Art

The fabrication of integrated circuits typically involves placing numerous devices on a single semiconductor substrate such as a silicon substrate. Isolation structures are used to electrically isolate one device from another. Individual devices are then interconnected by forming conducting lines over the isolation structures.

Among these isolation structures, a Shallow Trench Isolation (STI) structure has become popular because the device isolation area is small, and hence the resulting trench can be well adapted for device miniaturization. Typically, STI is formed by etching a shallow trench in a silicon substrate between areas where active devices are to be formed, and thereafter typically filling the trenches with a dielectric material.

However, conventional STI processes still have drawbacks. For example, defects can be formed in the silicon substrate due to the thermo-mechanical stress placed on the silicon substrate and the dielectric material during the STI process. The defects can be formed especially during the subsequent processes involving thermal cycles, such as various thermal oxidation, and source/drain implantation activation anneal processes.

The causes of the thermo-mechanical stress can be explained by several theories. One such theory is that the uneven volumetric expansion and contraction of the trench volume and filled dielectric volume, due to the differences between the coefficients of the thermal expansion of Si-substrate and the trench dielectric, induces large stress pinching at the interface of the Si-substrate and the trench dielectric. Furthermore, additional stress can be applied to the sidewalls of the trench during subsequent thermal processes. That is, the trench sidewalls can be subjected to oxidation, increasing the trench dielectric volume, which in turn, builds up the stress.

The stress becomes even more severe when a high-density plasma (HDP) oxide layer, which is now gaining popularity as a gap-fill material, is employed to fill the trench. The HDP oxide layer is very dense and is very susceptible to any thermal cycles applied on the STI structure. The high-density characteristic is the direct result of employed ions striking during the deposition of an HDP-film, so the HDP film filled in the STI structure can be considered as "Full"-fill, and any extra volumetric expansion will induce "Over"-fill. As described by Stiffler et al., "Oxidation-Induced Defect Generation in Advanced DRAM structures," IEEE Trans. On Electron Devices, vol. 37, 1990, pp. 1253–1257, the trench sidewall oxidation after trench dielectric fill can be viewed as driving a wedge between the Si-substrate and the trench dielectric, which severely stresses the Si-substrate.

Such stress is detrimental to the integrity of the active Si, especially on the sidewalls and bottom of STI, causing micro defects, i.e., dislocation due to damage of the silicon lattice, or shallow pits on the bottom and sidewalls of the trench, and on the active region of the semiconductor substrate. Thus, STI integrated devices present large leakage current problems, especially affecting the fabrication of high-density semiconductor devices. Such an increase in leakage current adversely impacts the performance and operability of the semiconductor devices. This problem is discussed in a paper entitled "Modeling of Cumulative Thermo-Mechanical Stress (CTMS) Produced by the Shallow Trench Isolation Process for 1 Gb DRAM and beyond," by Tai-Kyung Kim et al., IEDM Tech. Dig., 1998, pp. 145–148, 1998. Saino et al. shows the severely decreased data retention time with increasing temperature, which is correlated with the overly stressed Si-substrate, as well as high density of stress-induced dislocations, even with simple $N_2$ densification (See IEDM Tech. Dig., 1998, pp. 149–152). So, the STI is a very delicate and sensitive structure, and worse yet, it is also formed during the early stage of the whole process flow for IC fabrication.

Much effort has been devoted to overcome such stress/dislocation issues associated with STI. For example, there have been various attempts to optimize process flows, device tuning to work around this sensitive STI structure to overcome, for example, the stress-induced leakage current problem. For instance, as described in U.S. Pat. No. 6,281,081, Chien et al. teaches a low energy phosphorus implant for source/drain formation. However, these attempts severely limit device engineering freedom for performance optimization.

Accordingly, it would be desirable to provide a method of minimizing or reducing mechanical stress in current standard STI processes, from the early stage of the STI formation.

SUMMARY OF THE INVENTION

A shallow trench isolation (STI) structure in a semiconductor substrate and a method for forming the same are provided. A trench is formed in a semiconductor substrate. A first dielectric layer is formed on sidewalls of the trench. The first dielectric layer is formed thicker at a top portion of the sidewalls than a bottom portion of the sidewalls, leaving an entrance of the trench open to expose the trench. A second dielectric layer is conformally formed on the first dielectric layer to close the entrance, thus forming a void buried within the trench.

With the present invention, the stress between the trench dielectric layer and the surrounding semiconductor substrate during thermal cycling can be substantially reduced by allowing the trench dielectric layer to be expanded or shrunk with the surrounding substrate without generating stress. This is believed to be possible because the buried void acts as a buffer structure during thermal cycling.

The foregoing and other objects, features and advantages of the invention will become more readily apparent from the following detailed description of a preferred embodiment of the invention that proceeds with reference to the accompanying drawings.

DETAILED DESCRIPTION

To achieve the foregoing, the present invention provides modified shallow trench isolation (STI) processes that can absorb or relieve stress during thermal cycling in semiconductor manufacturing. In the following description, numerous specific details are set forth in order to provide a thorough understanding of the present invention. It will be apparent, however, to those skilled in the art, that the present invention may be practiced without some or all of the specific details. In other instances, well-known process steps, device structures, and techniques have not been described in detail in order to not unnecessarily obscure the invention.

FIGS. 1 to 4 schematically show cross-sectional views of the process steps of a method of forming STI in a semiconductor substrate according to an embodiment of the present invention.

Figure 1:
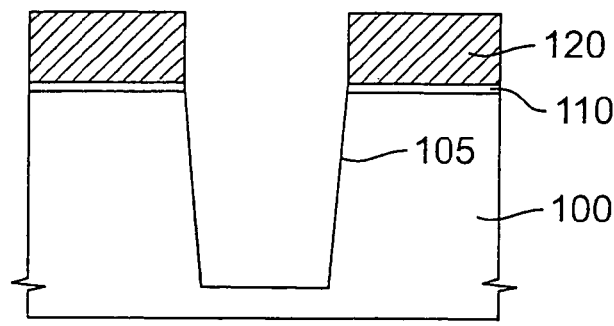
FIGS. 1–4 are schematic diagrams of a structure according to the present invention during various fabrication stages.

Referring to FIG. 1, a pad oxide layer is formed on a semiconductor substrate 100 such as a silicon substrate. Then, a silicon nitride layer is formed on the pad oxide layer. A pad oxide pattern 110 and a silicon nitride pattern 120 are formed by patterning the pad oxide layer and the silicon nitride layer, respectively. The pad oxide pattern 110 and the silicon nitride pattern 120 expose a portion of the semiconductor substrate 100 and define the area of a trench 105.

Thereafter, the trench 105 is formed using the silicon nitride pattern 120 as an etching mask by etching the substrate 100 to a depth of about 3,000 through 5,000 angstroms.

Subsequently, in order to remove substrate damage produced during the aforementioned etching process, a thermal oxide liner (not shown) can be formed on a bottom and sidewalls of the trench 105.

Figure 2:
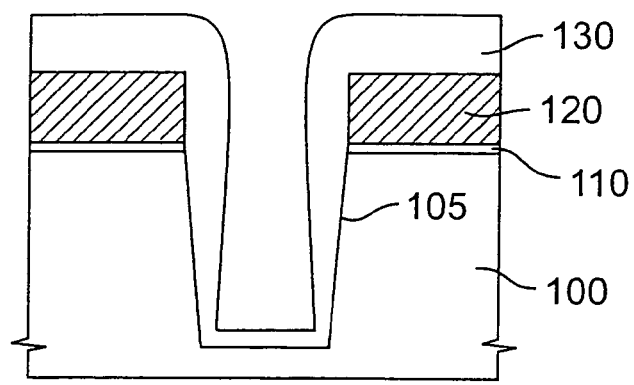
Figure 3:
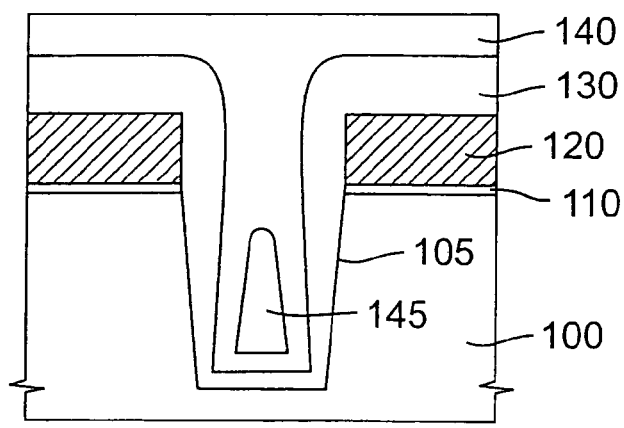

Referring to FIG. 2, a first dielectric layer 130 is formed on the sidewalls of the trench 105. The first dielectric layer 130 has less conformal step coverage so that it can be formed thicker at a top portion of the sidewalls than a bottom portion of the sidewalls of the trench 105 and leaving an entrance of the trench 105 open to expose the trench 105. In other words, the first dielectric layer 130 is formed on the sidewalls of the trench to form a constricted opening having a bottleneck structure. That is, a top portion of the second opening is substantially narrower than a bottom portion of the second opening, while an entrance of the second opening is left open to expose the trench 105.

Preferably, the first dielectric layer 130 can be formed using a plasma-enhanced chemical vapor deposition (PE-CVD) process. For example, the first dielectric layer 130 is formed of plasma-enhanced tetraethoxysilane-based (PE-TEOS) CVD-oxide or plasma-enhanced silane-based (PE-SiH$_4$) CVD-oxide. The first dielectric layer 130 is preferably formed to a thickness of about 300 to 700 angstroms. A person skilled in the art will appreciate that any other dielectric layer capable of forming poor step coverage films in accordance with the principles of the present invention can be used to form the first dielectric layer 130. Alternatively, the first dielectric layer 130 is formed of a high-density plasma chemical vapor deposition (HDP-CVD) oxide with no or very low sputtering power.

Next, a second dielectric layer 140 is conformally formed on the first dielectric layer 130 to a sufficient thickness to close the entrance and to form a void 145 buried within the trench 105. The second dielectrical layer 140 is formed by conformal deposition to prevent closing of the entrance. The combined thickness of layers 130, 140 is sufficient to occlude the entrance. The second dielectric layer 140 can be formed of thermally-driven 03-TEOS oxide or HDP-CVD oxide. The second dielectric layer 140 is preferably formed to a thickness of about 8000 angstroms. Any other dielectric layer capable of forming conformal films in accordance with the principles of the present invention can be used to form the second dielectric layer 140.

In one embodiment of the present invention, preferably, the first dielectric layer 130 is formed by HDP-CVD with a power of about 0 or 1500 to 2000 W and the second dielectric layer 140 is formed in situ by HDP-CVD with a power of about 3000 to 4000 W.

Preferably, the volume of the void 145 is at least about 5 percent of the total volume of the first and second dielectric layers 130, 140 within the trench 105 to absorb or relieve thermo-mechanical stress resulting from thermal expansion or shrinkage during subsequent thermal cycling. The trench dielectric layer (i.e., the dielectric layers 130, 140 that fill the trench 105) may be allowed to shrink or expand between about 5–10 percent of the total original volume of the trench dielectric layer. Thus, if the volume of the void 145 is about at least 5 percent of the total volume of the trench dielectric layer, the stress applied on the trench sidewalls can be successfully absorbed or relieved by the buried void 145.

According to another embodiment of the present invention, after forming the first dielectric layer 130, an annealing process can be performed on the substrate 100 including the first dielectric layer 130. The annealing process is preferably performed in an oxygen atmosphere at a temperature range of about 1050 to 1100° C. With this annealing, micro-trenching problems that frequently occur in a trench dielectric layer during subsequent etching steps can be avoided. Thus, problems such as a silicon sidewall corner exposure and a sub-threshold leakage problem can be reduced with the present invention. Also, the annealing process ensures that the process steps of forming the second dielectric layer 140 and the process steps of forming the first dielectric layer 130 are decoupled, so that they have less influence on each other.

Figure 4:
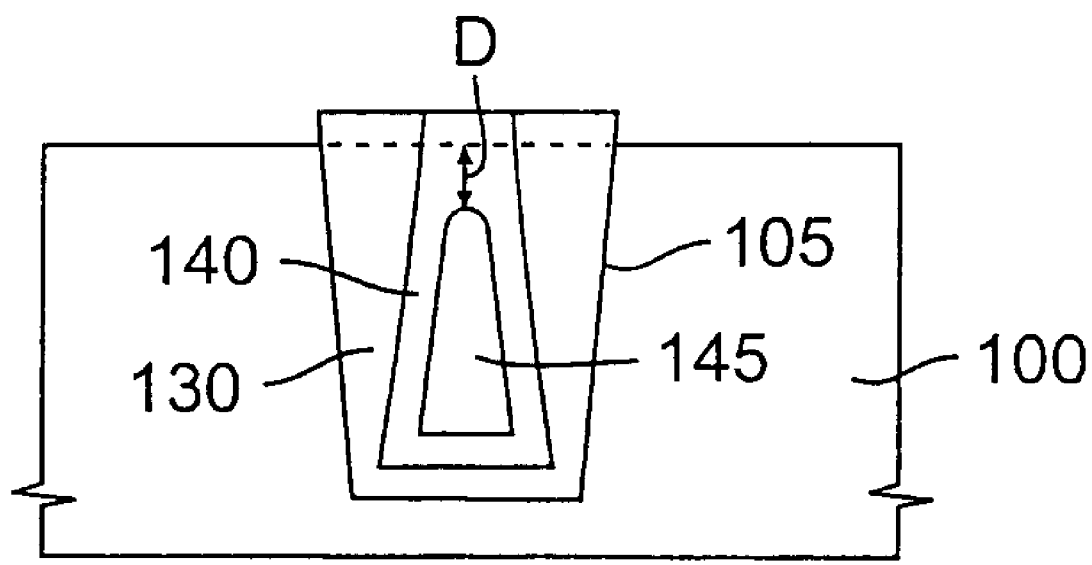

Referring to FIG. 4, the substrate 105 including the first and second dielectric layers 130, 140 is subsequently planarized. In particular, a planarization process is carried out to planarize the deposited layers 140, 130 down to the silicon nitride pattern 120. Then, the silicon nitride pattern 120 and the pad oxide layer 110 are removed by a suitable method such as etching. Thus, a novel shallow trench isolation (STI) structure having a void 145 can be completed in accordance with an embodiment of the present invention.

According to one aspect of the present invention, the void 145 buried within the trench 105 needs to be formed deep enough so that the buried void 145 is not exposed through the second dielectric layer 140 during the subsequent processing steps, such as chemical mechanical polishing (CMP) or wet cleaning steps. For example, a top of the void needs to be at least about 500–1000 angstroms below the top surface of the substrate 105 to avoid being exposed. The depth is indicated in FIG. 4 by reference character D. Therefore, as illustrated, the void 145 buried within the trench 105 is formed substantially at a bottom portion thereof and not at the top portion thereof. Also, because the void 145 is buried deep within the trench dielectric layer, an unwanted "poly stringer" can be avoided. The poly stringer can be formed if polysilicon remains under the overhang portion of the trench dielectric layer. If the stringer material is conductive, as in the case of polysilicon, it may lead to electrical shorts in the circuitry.

With the present invention, the stress between the trench dielectric layer and the surrounding silicon substrate 105 during thermal cycling can be substantially reduced. This is because, as discussed above, the present invention STI structure allows the trench dielectric layer to expand or shrink with the surrounding silicon substrate without generating stress, because the buried void 145 of the present invention STI structure acts as a buffer structure during thermal cycling.

As a result, defects in the substrate can be reduced and current leakage is accordingly decreased. Thus, the electrical characteristics of the STI integrated circuits are improved.

Additionally, because the void 145 including air or vacuum having the least conductivity or the lowest dielectric constant is included in the trench dielectric layer, the capacitance of the trench dielectric layer can be reduced, while sufficiently maintaining electrical isolation. In contrast, a porous oxide of the prior art is not suitable for isolation due to current leakage.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method for forming a shallow trench isolation (STI) structure in a semiconductor substrate, the method comprising:
   forming a trench in a semiconductor substrate;
   forming a first dielectric layer on sidewalls of the trench, the first dielectric layer being formed thicker at a top portion of the sidewalls than a bottom portion of the sidewalls and leaving an entrance of the trench open to expose the trench; and
   conformally forming a second dielectric layer on the first dielectric layer to close the entrance and form a void buried within the trench.

2. The method of claim 1, further comprising planarizing the substrate including the second dielectric layer to form an STI structure.

3. The method of claim 1, wherein forming the first dielectric layer comprises performing a plasma enhanced chemical vapor deposition (PE-CVD) process.

4. The method of claim 3, further comprising annealing after forming the first dielectric layer.

5. The method of claim 3, wherein the first dielectric layer is formed of plasma-enhanced tetraethoxysilane-based (PE-TEOS) oxide or plama-enhanced silane-based (PE-SiH$_4$) CVD oxide.

6. The method of claim 1, wherein forming the first dielectric layer comprises performing a high-density plasma chemical vapor deposition (HDP-CVD) process.

7. The method of claim 1, wherein the second dielectric layer is formed of 03-TEOS oxide or HDP-CVD oxide.

8. The method of claim 1, wherein the first dielectric layer is formed by HDP-CVD with no power or a power of about 1500 to 2000 W and the second dielectric layer is formed by HDP-CVD with a power of about 3000 to 4000 W.

9. The method of claim 1, wherein the first dielectric layer is formed to a thickness of about 300 to 700 angstroms.

10. The method of claim 1, wherein the second dielectric layer is formed to a thickness of about 8000 angstroms.

11. The method of claim 1, wherein the volume of the void is at least about 5 percent of the total volume of the insulating layer within the trench to absorb a thermo-mechanical stress during thermal cycling.

12. The method of claim 11, wherein the volume of the void is about 10 percent.

13. The method of claim 1, wherein forming the isolation trenches further comprises:
   forming a pad oxide layer on the semiconductor substrate;
   forming a silicon nitride layer on the pad oxide layer;
   patterning the silicon nitride layer to define the trench; and
   etching the semiconductor substrate using the patterned silicon nitride layer as a mask to form the trench in the semiconductor substrate.

14. A method for forming a shallow trench isolation (STI) structure in a semiconductor substrate, the method comprising:
   forming a first opening depthwise in a semiconductor substrate;
   forming a first dielectric layer on sidewalls of the first opening to form a second opening having a bottleneck structure so that a top portion of the second opening is substantially narrower than a bottom portion of the second opening, wherein an entrance of the second opening is left open to expose the trench; and
   conformally forming a second dielectric layer on the first dielectric layer to close the entrance of the second opening and form a void buried within the trench.

* * * * *